(12) United States Patent
Hayashi

(10) Patent No.: US 6,368,450 B2
(45) Date of Patent: *Apr. 9, 2002

(54) PROCESSING APPARATUS

(75) Inventor: Kazuichi Hayashi, Kofu (JP)

(73) Assignee: Tokyo Electron Limited (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/443,701

(22) Filed: Nov. 19, 1999

Related U.S. Application Data

(63) Continuation of application No. PCT/JP98/02094, filed on May 12, 1998.

(51) Int. Cl.$^7$ .............................. H01L 21/00; H05H 1/00
(52) U.S. Cl. .................... 156/345; 118/723 E; 118/728
(58) Field of Search ........................ 156/345; 118/728, 118/723 E

(56) References Cited

U.S. PATENT DOCUMENTS

| | | |
|---|---|---|
| 5,584,936 A | 12/1996 | Pickering et al. |
| 5,846,332 A * | 12/1998 | Zhao et al. ................. 118/728 |
| 5,863,340 A * | 1/1999 | Flanigan ..................... 118/728 |

FOREIGN PATENT DOCUMENTS

| | | |
|---|---|---|
| EP | 0 489 439 | 6/1992 |
| EP | 0 807 960 | 11/1997 |

* cited by examiner

*Primary Examiner*—Thi Dang
(74) *Attorney, Agent, or Firm*—Morrison & Foerster

(57) ABSTRACT

A processing apparatus includes a susceptor provided in a processing chamber and having an upper surface with a support area on which a semiconductor wafer is placed, and an aligning ring member movably arranged on the upper surface of the susceptor to surround the support area, the ring member defining the shift of the wafer placed on the support area and formed of a material having a thermal expansion coefficient smaller than that of the susceptor. A plurality of projections are provided on the peripheral portion of the upper surface of the susceptor at intervals along the ring member. A plurality of slots are provided in the aligning ring member for receiving the corresponding projections. The slots permit relative movement of the projection received therein in a radial direction of the ring member, but prohibit relative movement of the projections received therein in a rotating direction of the ring member as a whole.

23 Claims, 6 Drawing Sheets

PROCESSING APPARATUS

CROSS REFERENCE TO RELATED APPLICATIONS

This is a Continuation of Application PCT/JP98/02094, filed May 12, 1998.

BACKGROUND OF THE INVENTION

The present invention relates to a processing apparatus having a ring member for holding a processing object such as a semiconductor wafer at an alignment position on a susceptor.

Generally in manufacturing a semiconductor integrated circuit, processing including film formation and pattern etching is repeatedly executed to form a large number of desired elements on a substrate such as a semiconductor wafer. Such processing is performed by placing the wafer on a susceptor inside a processing chamber, and then supplying processing gas such as film formation gas or etching gas from a shower head into the processing chamber while the interior of the processing chamber is kept in vacuum.

In this case, to ensure high processing uniformity in the plane of the wafer in, e.g., film formation and etching, the wafer must be aligned and placed on the susceptor with high precision and prevented from sliding and moving on the susceptor surface upon the placement. In particular, even a slight shift of the wafer within the plane or even a slight difference in horizontal level between the upper ends of lifter pins for vertically moving the wafer with respect to the susceptor may lead to sliding movement of the wafer on the susceptor upon placing the wafer on the support surface of the susceptor by the lifter pins.

In general, to prevent the movement of the wafer, an aligning guide ring having an inner diameter slightly larger than the diameter of the wafer is fixed to the peripheral edge portion of the susceptor, and the wafer is placed within the ring.

FIG. 10 is a schematic sectional view of a conventional susceptor. FIG. 11 is a plan view of the susceptor. As shown in FIGS. 10 and 11, a guide ring 4 having an L-shaped section is fitted on the peripheral edge portion of a thick disk-like susceptor 2. An inner diameter L1 of the guide ring 4 is set slightly larger than a diameter L2 of a wafer W by, e.g., about 1 mm. By placing the wafer W on the support surface of the susceptor 2 within the guide ring 4, the wafer W is aligned and prevented from largely moving, i.e., sliding on the support surface.

The susceptor 2 and the guide ring 4 are generally made of a ceramic material such as alumina ($Al_2O_3$) or aluminum nitride (AlN). If the constituent material of the susceptor 2 is the same as that of the guide ring 4, their thermal expansion coefficients are the same, and thus no problem occurs. If, however, their constituent materials are different, their thermal expansion coefficients are also different. The thermal expansion difference between the susceptor 2 and the guide ring 4 which are exposed to high temperatures up to, e.g., about 800° C. exceeds an allowable value. As a result, the guide ring 4 may loosen or break.

As the wafer size increases to 8" and 12", the sizes of the susceptor 2 and the guide ring 4 also increases, and a slight difference in thermal expansion coefficient results in a large thermal expansion difference.

In recent years, in a plasma processing apparatus, it has been contemplated to use an alloy with high conductivity and excellent corrosion resistance for the susceptor itself in order to improve the uniformity of the plasma density by suppressing the potential difference within the support surface and the potential difference between the susceptor and the side wall of the chamber. In this case, however, the difference in thermal expansion coefficient between the alloy and the ceramic material forming the guide ring 4 becomes very large, and the guide ring may loosen or break, as described above.

In this case, the guide ring itself may be made of the same alloy material as that of the susceptor 2. However, since the thickness of the guide ring 4 is as small as, e.g., about 1 mm, if the guide ring 4 is made of an alloy material inferior in rigidity to the ceramic material, it thermally deforms and cannot stand practical use. Thus, such material is practically not employed.

The guide ring 4 is freely rotatable in the circumferential direction of the susceptor 2. For this reason, when, for example, the guide ring 4 is dismounted from the susceptor 2 for the purpose of maintenance, the guide ring 4 is very difficult to precisely mount back into its place.

BRIEF SUMMARY OF THE INVENTION

It is an object of the present invention to provide a processing apparatus having an aligning ring member which neither breaks nor is misaligned even if the ring member is formed of a material with a thermal expansion coefficient different from that of a susceptor.

According to an aspect of the present invention, there is provided a processing apparatus comprising a processing chamber, a susceptor which is placed in the processing chamber and has one surface with a support area on which a processing object is set, processing means for processing the processing object set on the support area, an aligning ring member which is arranged on the surface of the susceptor so as to surround the support area, and defines movement of the processing object placed on the support area along the surface, and movement regulating means, provided to the aligning ring member and the susceptor, for permitting relative movement of the aligning ring member and the susceptor in a radial direction due to thermal expansion/contraction difference of the alignment ring member and the susceptor while prohibiting relative rotation thereof.

In this processing apparatus, even if the temperatures of the susceptor and the ring member change upon repeat processing for processing objects, and a thermal expansion difference is generated between the susceptor and the ring member, the expansion/contraction amount is absorbed by the movement regulating means. Therefore, the aligning ring member can be prevented from receiving excessive stress and breaking, and in addition from loosening.

Further, the aligning ring member itself can be aligned with the susceptor.

DETAILED DESCRIPTION OF THE INVENTION

A processing apparatus according to an embodiment of the present invention will be described in detail below by exemplifying a plasma film forming apparatus with reference to FIGS. 1 to 4.

Figure 1:
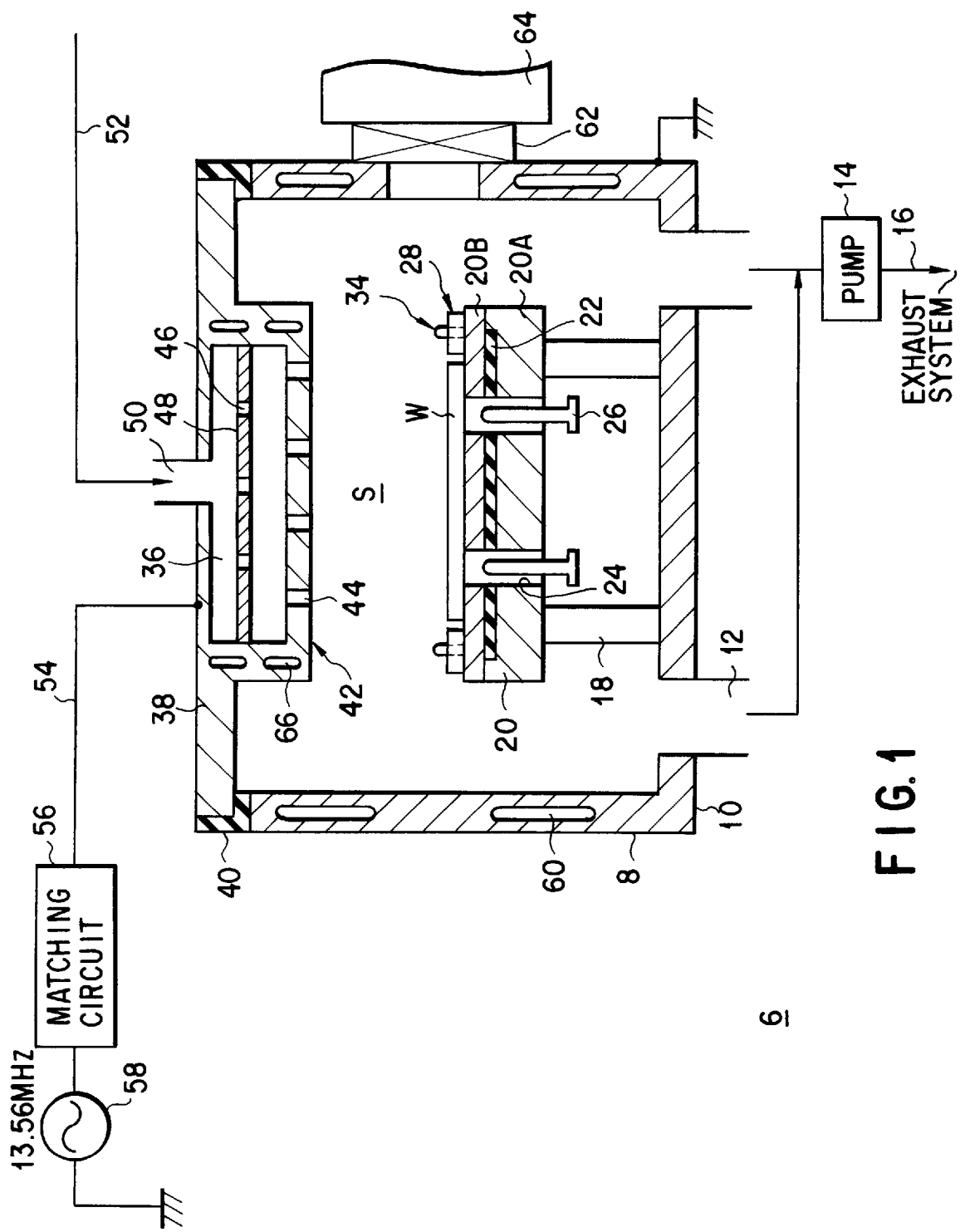
FIG. 1 is a view schematically showing a processing apparatus according to an embodiment of the present invention.

As shown in FIG. 1, a plasma film forming apparatus 6 comprises a cylindrical processing chamber 8, which is grounded. A plurality of exhaust ports 12 for evacuating the interior of the chamber are formed in a bottom wall 10 of the processing chamber 8. An exhaust system 16 is connected to these exhaust ports 12 through a pump 14 to uniformly evacuate the interior of the processing chamber 8 from a portion around the bottom wall. A disk-like susceptor 20 is set in the processing chamber 8 through a plurality of, e.g., three, columns 18 made of a conductive material. A processing object, e.g., a semiconductor wafer W can be placed on a support area of an upper surface, i.e., support surface of the susceptor 20. In this preferred embodiment, the upper surface of the susceptor 20 is horizontal, but may be inclined. The susceptor 20 also serves as a lower electrode and is made up of a lower susceptor 20A directly supported by the columns 18 and an upper susceptor 20B joined to the upper surface of the lower susceptor 20A. The joined surface between the lower and upper susceptors 20A and 20B is recessed, and a resistance heater 22 is fitted in the recessed portion. The lower and upper susceptors 20A and 20B are joined by, e.g., welding at the joined surface.

The susceptor 20, i.e., the lower and upper susceptors 20A and 20B are made of an alloy containing, e.g., 20% to 23% of Cr, 12 to 15% of Mo, 2 to 4% of W, 2 to 6% of Fe, and the balance of Ni and impurities. Components of impurities are 2.5% or less of Co, 0.08% or less of Si, 0.5% or less of Mn, and 0.015% or less of C. Such an alloy material is generally commercially available as Hastelloy (trademark). The entire susceptor may be formed using, e.g., this Hastelloy. This alloy material has relatively high conductivity and high corrosion resistance against ClF-based gas used as cleaning gas.

A plurality of pin holes 24, e.g., three, pin holes located at, e.g., the vertexes of a regular triangle, are formed in the susceptor 20 to vertically extend through it. A lifter pin 26 vertically retractable from the susceptor 20 is inserted in each pin hole 24. These lifter pins 26 are moved up/down by an elevator mechanism (not shown) so as to support the lower surface of the wafer by the upper ends of the three lifter pins 26 in loading/unloading the wafer W.

Figure 2:
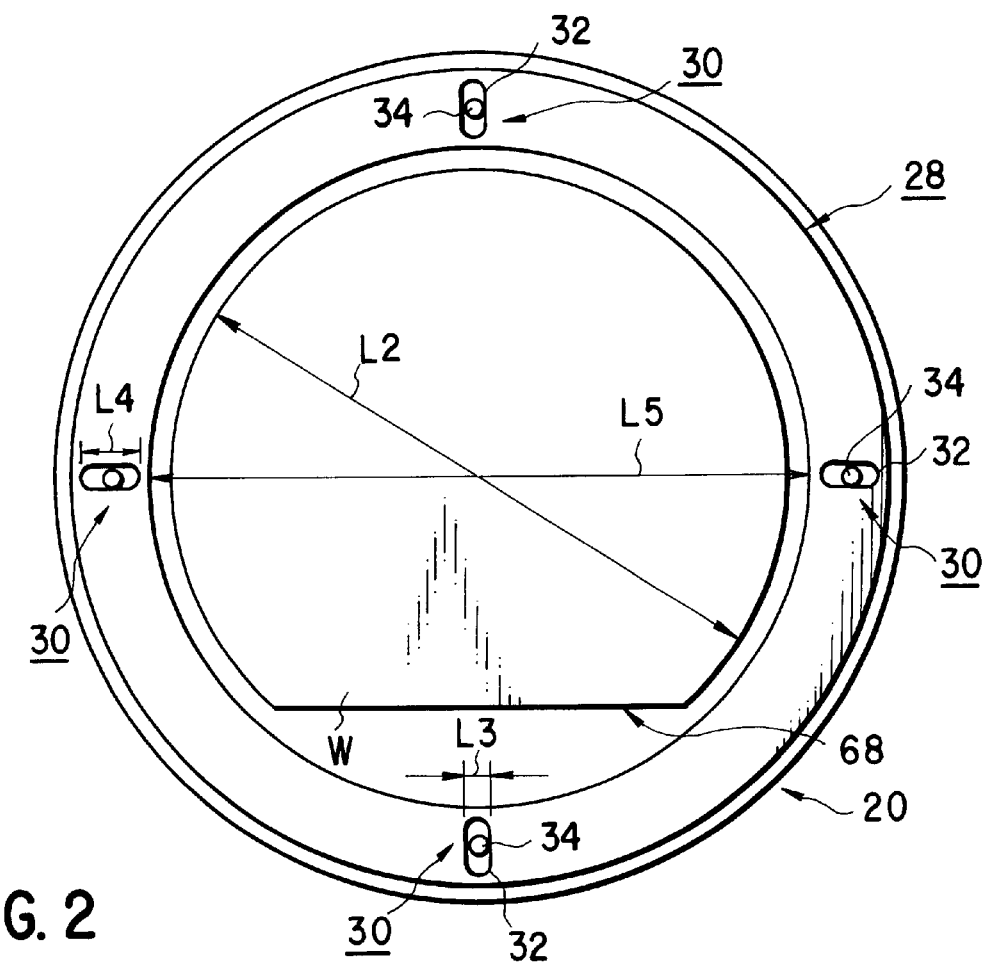
FIG. 2 is a plan view showing a susceptor and an aligning ring member in the processing apparatus shown in FIG. 1.
Figure 3:
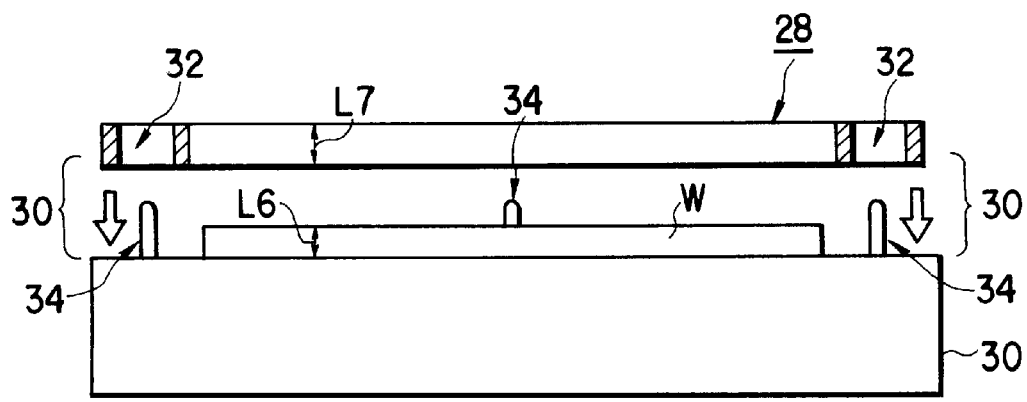
FIG. 3 is a view showing both the aligning ring member and the susceptor before the aligning ring member is mounted on the susceptor.
Figure 4:
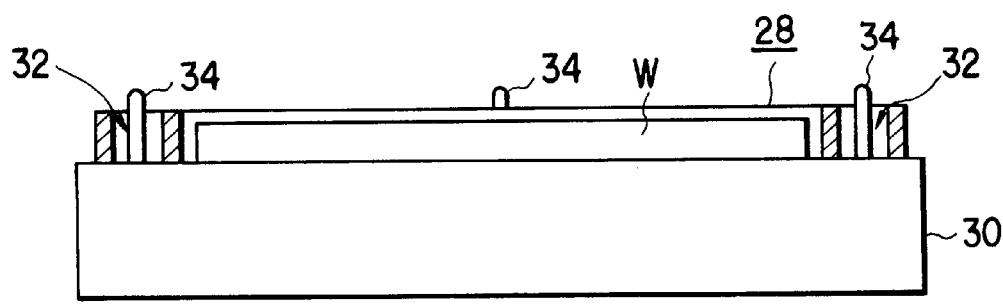
FIG. 4 is a view showing the aligning ring member and the susceptor upon the mounting.

An aligning circle ring member 28 is provided on the peripheral portion of the upper surface of the susceptor 20. More specifically, as shown in FIGS. 2 to 4, the aligning ring member 28 is a ring-like thin flat member set on the upper surface of the susceptor so as to surround the semiconductor wafer W to be placed on the support area of the susceptor. This ring member is formed of a nonmetallic material, e.g., a ceramic material which has a thermal expansion coefficient greatly different from (smaller than) that of the alloy forming the susceptor 20, and is excellent in heat resistance and rigidity.

Examples of such a ceramic material are aluminum oxide ($Al_2O_3$) and aluminum nitride (AlN). In addition, silicon compounds such as SiC and $SiO_2$ are also available.

A plurality of, e.g., four movement regulating mechanisms 30 (FIG. 2) for safely permitting thermal expansion/contraction of the aligning ring member 28 and prohibiting the circumferential movement of the aligning ring member 28 while associating the aligning ring member 28 with the susceptor 20 are mounted to have equal intervals (an angle of 90° in the illustrated example) in the circumferential direction of the aligning ring member 28.

Each movement regulating mechanism 30 includes a movement allowing elongated hole or slit 32 which is formed in the aligning ring member 28 and extends in the radial direction of the circular ring member 28 and thus the susceptor 20, and a columnar susceptor side movement regulating projection 34 vertically projecting from the upper peripheral edge portion (around the support area) of the susceptor 20. The diameter of the regulating projection 34 is smaller than a width L3 (FIG. 2) of the elongated hole 32 so as to enable insertion of the regulating projection 34 in the elongated hole 32 serving as a guide. However, the diameter of the regulating projection 34 is set only slightly smaller than the width L3 of the elongated hole 32 so as to prevent circumferential movement of the ring member 28 on the susceptor 20, and to permit the projection 34 to relatively move within the elongated hole 32 in the radial direction of the aligning ring member 28, i.e., guide the projection 34 along the elongated hole. The projection 34 may be formed integrally with the susceptor 20, or formed separately and attached to the susceptor. In the latter case, the projection may be made up the same or different material against the susceptor. The elongated hole 32 has a length L4 large enough to absorb the thermal expansion difference between the susceptor 20 and the aligning ring member 28, e.g., a length of about 5 mm. With this setting, the thermal expansion difference in the radial direction between the susceptor and the ring member which is generated upon a change in temperature can be absorbed. In the embodiment shown in FIG. 2, the projection 34 is located at almost the center of the elongated hole 32 in the longitudinal direction in consideration of not only heating but also cooling of the susceptor 20. If the susceptor 20 is only heated during processing, the projection 34 is preferably inserted in the elongated hole so as to be located near the end portion of the elongated hole 32 on the inner side of the ring member in the longitudinal direction. To the contrary, if the susceptor 20 is only cooled during processing, or the thermal expansion coefficient of the susceptor is smaller than that of the ring member though the susceptor 20 is heated, the projection 34 is inserted in the elongated hole 32 so as to be located near the end portion of the elongated hole 32 on the outer side of the ring member in the longitudinal direction.

As shown in FIG. 2, an inner diameter L5 of the ring member 28 is set larger than a diameter L2 of the wafer W by about 1 mm, so that the wafer can be aligned with precision of ±1 mm. When, therefore, the wafer W is located at the center of the ring member 28 with high precision, the gap between the peripheral portion of the wafer and the inner circumferential portion of the ring member 28 is about 0.5 mm except for the orientation flat portion. As shown in FIG. 3, a thickness L6 of the wafer W is, e.g., about 0.8 mm, whereas a thickness L7 of the ring member 28 is, e.g., about 1.5 mm. Both the wafer W and the ring member 28 are made very thin.

As shown in FIG. 1, an upper wall 38 on which a shower head 36 serving as an upper electrode is mounted integrally or detachably, is airtightly attached to the circumferential wall of the processing chamber 8 through an insulating ring 40 at the ceiling portion of the chamber 8. The shower head 36 has a cylindrical shape with a lower surface facing nearly the entire upper surface of the susceptor 20. The shower head 36 and the susceptor 20 define a processing space S between them. The shower head 36 showers various gases in the processing space S. A spray surface 42 as the lower surface of the shower head 36 has many spray holes 44 for spraying gas. A diffusion plate 48 having many diffusion holes 46 is horizontally arranged inside the shower head 36 to diffuse gas within the head. The circumferential wall of the shower head 36 incorporates a head temperature control jacket 66 for selectively flowing, e.g., a cooled or heated heat transfer medium, as needed, in order to control the temperature of the wall surface.

A gas inlet port 50 for introducing gas into the head is formed at the center of the upper portion of the shower head 36. A supply path 52 for supplying gas is connected to the gas inlet port 50. Various gas sources (not shown) are connected to the supply path 52. For example, $TiCl_4$ gas and $H_2$ gas are used as Ti film forming gas, Ar gas is used as plasma gas, and ClF-based gas such as $ClF_3$ gas is used as cleaning gas. A matching circuit 56 and an RF power supply 58 of, e.g., a 13.56 MHz are connected to the upper wall 38 through a lead 54 in order to generate a plasma in the processing spaces, e.g., forming a Ti film.

The circumferential wall of the processing chamber 8 incorporates a chamber temperature control jacket 60 for selectively flowing, e.g., a cooled or heated heat transfer medium, as needed, in order to control the temperature of the wall surface. A gate valve 62 which opens/closes in loading/unloading a wafer is formed in the circumferential wall of the chamber, and a loadlock chamber 64 is connected to the chamber through the valve 62.

The operation of the apparatus having the above arrangement will be explained in relation with formation of a Ti film as an example of film forming operation.

The wafer W in the load-lock chamber 64 is loaded by a convey arm (not shown) into the processing chamber 8 through the opened gate valve 62, and transferred on to the top ends of the lifter pins 26 having moved up from under the susceptor 20. Upon the transfer, the lifter pins 26 are moved down to place the wafer surrounded by the aligning ring member 28 on the support area of the upper surface of the susceptor 20. At this time, even if the wafer W is obliquely placed on the support surface due to some reason and slides on the support surface, the movement of the wafer W is regulated by the aligning ring member 28 arranged at the peripheral edge portion of the susceptor 20. Therefore, the wafer can be aligned with high alignment precision.

After the wafer W has been placed, $TiCl_4$ gas and $H_2$ gas as film forming gas, and Ar gas as plasma gas are respectively supplied into the processing chamber 8 through the shower head 36 at predetermined flow rates. The interior of the processing chamber 8 is evacuated by the pump 14 to maintain the chamber interior in a predetermined low-pressure state.

At the same time, an RF power of 13.56 MHz is applied from the RF power supply 58 to the shower head 36 serving as an upper electrode to apply an RF electric field between the shower head 36 and the susceptor 20 serving as a lower electrode. As a result, the Ar gas is excited into a plasma to promote reduction of the $TiCl_4$ gas and the $H_2$ gas, thereby forming a Ti film on the wafer surface.

During the formation of the film, the wafer W is heated to a predetermined temperature by the resistance heater 22 buried in the susceptor 20. The circumferential wall of the processing chamber 8 and the shower head 36 which are easily heated in a high temperature by the plasma are cooled to predetermined temperatures by flowing refrigerants through their jackets 60 and 66.

At this time, the processing is performed under the conditions: the temperature of the wafer: about 700° C., the temperature of the circumferential wall of the chamber: about 130° C., the temperature of the shower head 36: about 130° C., the process pressure: about 1 Torr, and the RF power: about 700W.

In this way, a film is formed using the conductive susceptor 20 made of an alloy such as Hastelloy (trademark). Thus, the susceptor 20 and the circumferential wall of the chamber are kept at almost the same potential. Consequently, the plasma density in the processing space S becomes approximately uniform. This enables plasma CVD film formation of the Ti film without any charge-up damage to many elements formed on the surface of the wafer.

In this film forming operation, since the wafer is heated to about 700° C., as described above, the susceptor 20 and the aligning ring member 28 located at the upper peripheral edge portion of the susceptor 20 are also heated to about 700° C., and a very large thermal expansion difference of, e.g., about 2 mm is generated between the two members owing to the difference in thermal expansion coefficient between them. Since the susceptor 20 made of an alloy has a larger thermal expansion coefficient than that of the ring member 28 made of a ceramic material, a much larger expansion force radially acts on the susceptor 20 than on the ring member 28. At this time, the susceptor side movement regulating projection 34 projecting from the upper surface of the susceptor 20 can relatively move in the longitudinal direction within the movement allowing elongated hole 32 formed in the ring member 28 so that the susceptor 20 can radially expand with respect to the ring member 28 to absorb the thermal expansion. Therefore, the ring member 28 can be prevented from receiving large stress and breaking.

In particular, the thermal expansion difference between the ring member 28 made of a ceramic material and the susceptor 20 made of an alloy becomes large at a processing temperature of 700° C. By setting the length L4 of the elongated hole 32 sufficiently large, thermal expansion/contraction can be satisfactorily absorbed even if the temperature is repeatedly increased/decreased. The ring member 28 can be prevented from receiving stress and breaking.

Since the width L3 of the elongated hole 32 is set slightly larger than the diameter of the movement regulating projection 34, the ring member 28 is prevented from relatively moving in the circumferential direction of the susceptor 20 by thermal contraction, and the circumferential movement of the ring member 28 can be regulated. Therefore, the ring member 28 itself is hardly loosed, the wafer W is not misaligned, and the alignment precision of the wafer W does not decrease.

When, e.g., a high-rigidity ceramic material is used for the ring member 28, the ring member 28 does not thermally deform even if the thickness L7 of the ring member 28 is as small as, e.g., about 1.5 mm.

Further, in remounting the ring member 28 on to the susceptor 20 after dismounting it for the purpose of maintenance, the ring member 28 itself can be aligned with the susceptor 20 by fitting the regulating projections 34 in the original corresponding elongated holes 32.

In the above embodiment, although the movement allowing elongated hole of the movement regulating mechanism is formed as a through hole which allows the regulating projection to extend therethrough, this elongated hole may be formed as a blind hole, i.e., groove which does not allow the regulating projection to extend therethrough.

Figure 5:
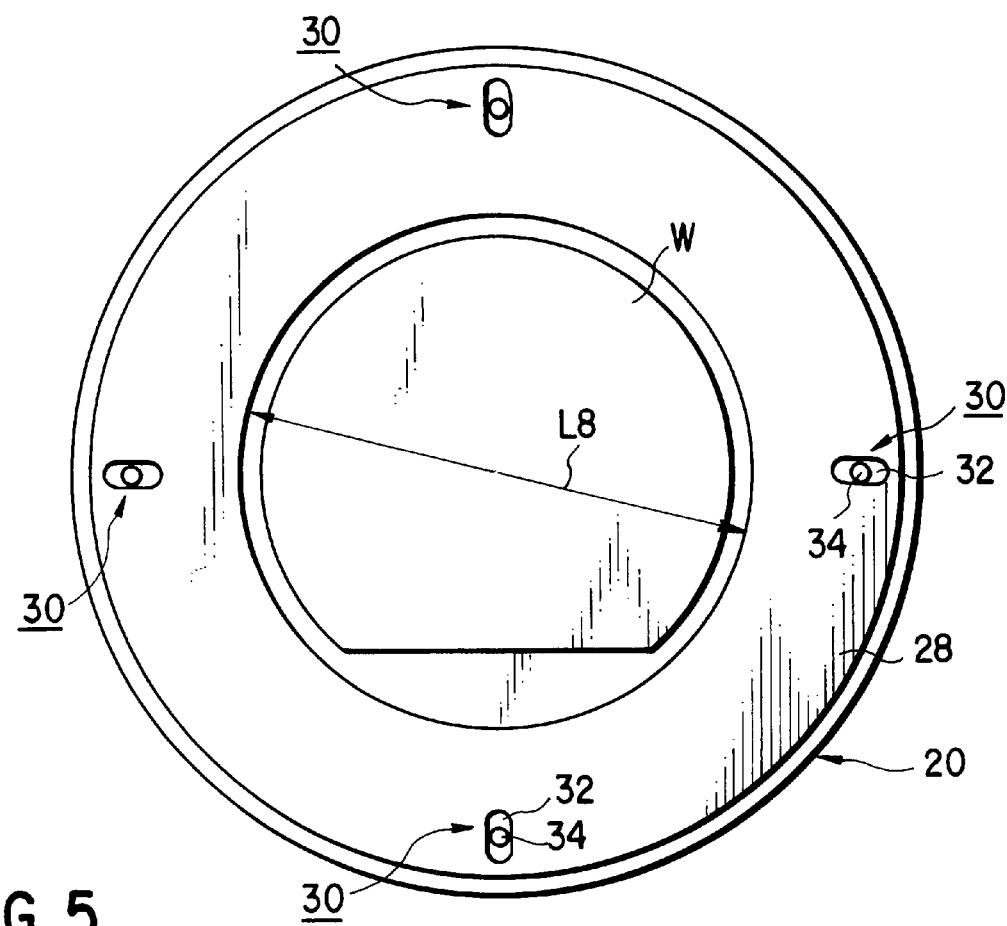
FIG. 5 is a plan view showing the susceptor on which another aligning ring member corresponding to a processing object with a different size is mounted.

FIG. 5 shows an aligning ring member 28 having an inner diameter L8 different from, e.g., smaller than the inner diameter L5 of the ring member 28 shown in FIG. 2. If a plurality of aligning ring members having different inner diameters are prepared in correspondence with various wafer sizes, the processing apparatus can be easily applied to any wafers with different sizes such as 12", 8", and 6" wafers by only exchanging the aligning ring member 28.

Figure 6:
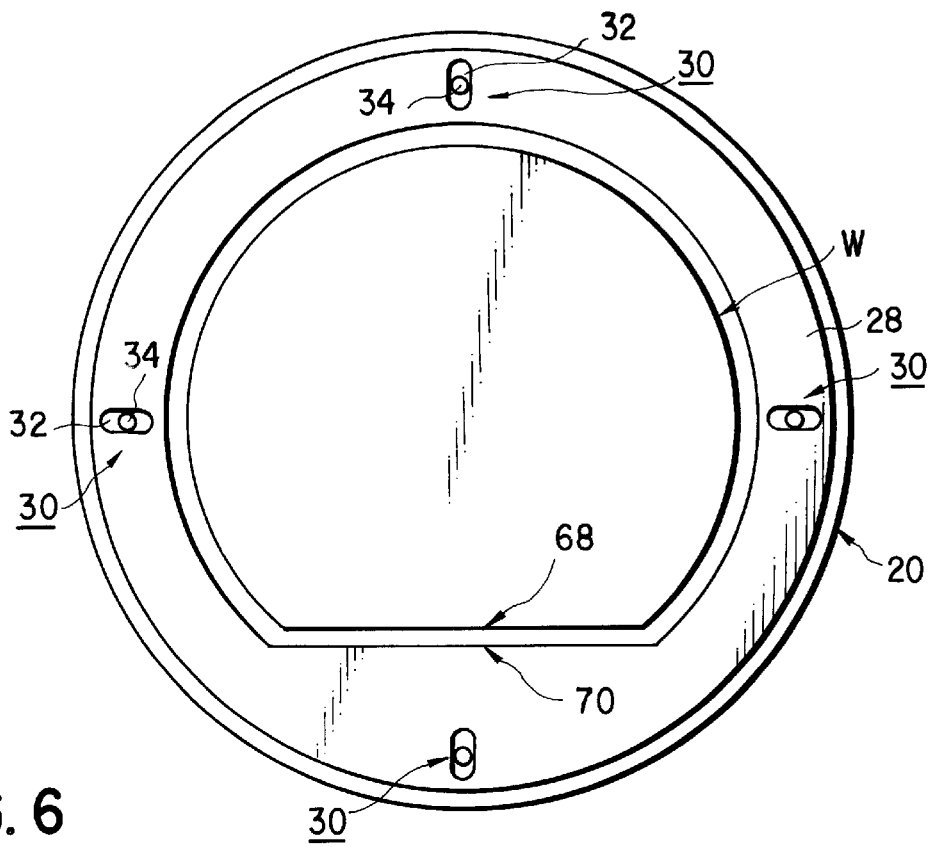
FIG. 6 is a plan view showing the susceptor on which an aligning ring member having an orientation flat portion is mounted.

In general, the wafer W has an orientation portion for orientating the wafer W, i.e., an orientation flat 68 (or notch). As shown in FIG. 6, the aligning ring member 28 may also comprise a corresponding portion such as an orientation flat portion 70 (or a projection of a shape complemental with the notch) in correspondence with the orientation flat 68 (or notch). This corresponding or complemental portion also contributes to the alignment of the wafer W, resulting in higher alignment precision. In this case, if the ring member 28 is remounted on the susceptor 20 with reference to the orientation flat portion 70 upon maintenance, the ring member 28 can be easily reset at the original position, i.e., not a position where the ring member 28 is located upon circumferential rotation but the original position. In this manner, the inner circumferential surface of the ring member 28 of the present invention desirably has a shape conforming to the outer peripheral shape of the processing object at a predetermined small gap over almost the entire periphery, i.e., a complementary shape. The ring member is not limited to a circular shape, and may be formed into another shape, e.g., a rectangular shape for a rectangular processing object such as an LCD substrate. In this case, the radial direction means a direction not extending along the ring member, for example, a direction toward a gravity center of the rectangular ring member.

Figure 7:
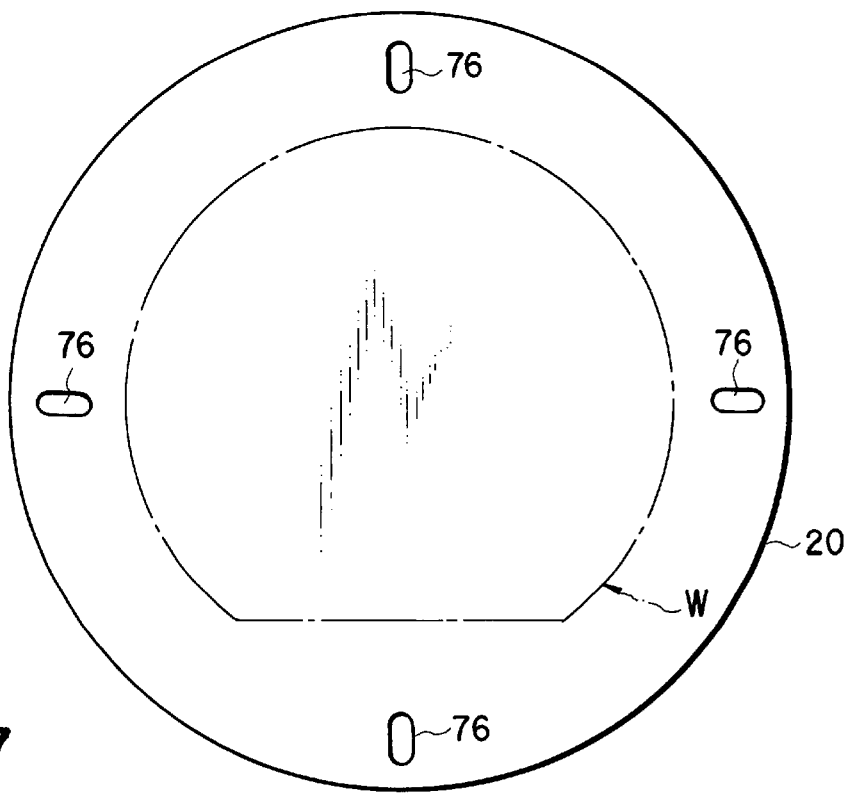
FIG. 7 is a plan view showing a modification of the susceptor according to the present invention.
Figure 8:
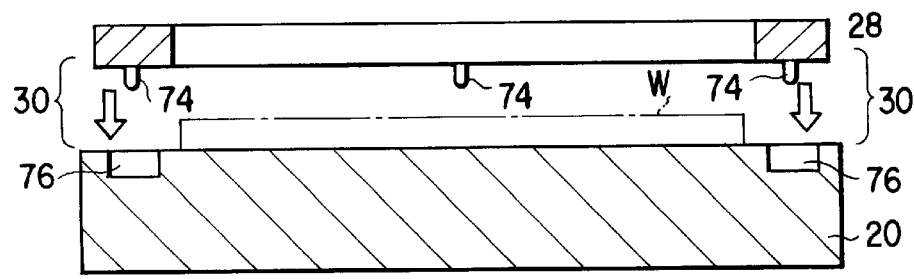
FIG. 8 is a view showing the modification of the aligning ring member and the susceptor according to the present invention.
Figure 10:
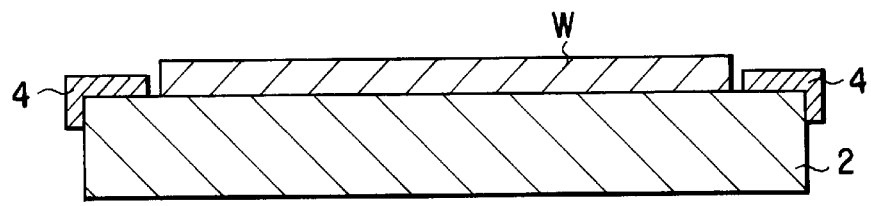
FIG. 10 is a view showing a susceptor on which a conventional guide ring is mounted.
Figure 11:
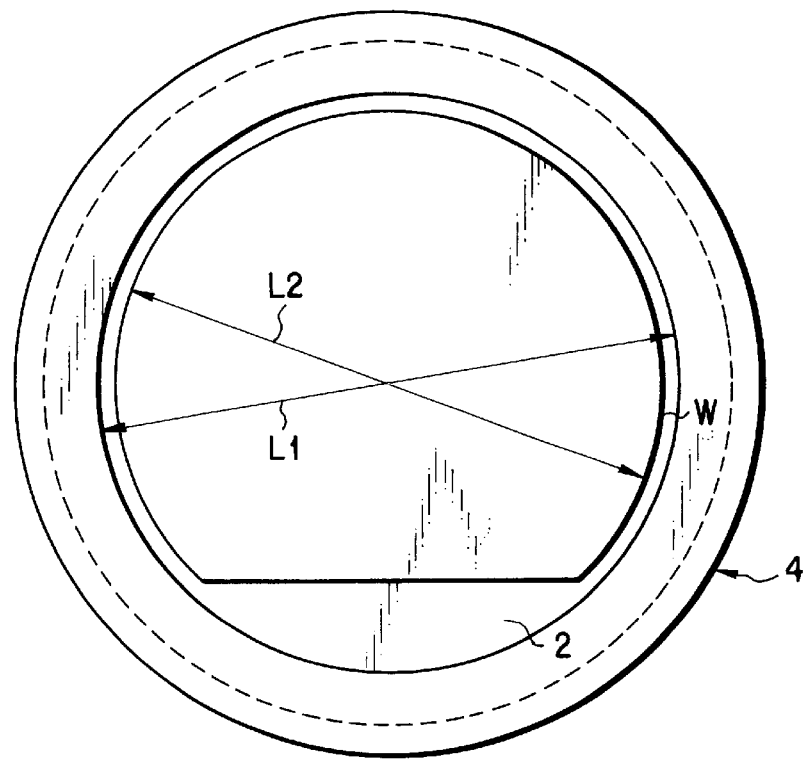
FIG. 11 is a plan view showing the susceptor on which a conventional guide ring is mounted.

The above embodiment has exemplified the case wherein, as the movement regulating mechanism 30, the elongated hole 32 is formed on the ring member 28 side, and the projection 34 is formed on the susceptor 20 side. Alternatively, they may be formed on reverse sides, as shown in FIGS. 7 and 8. As shown in FIG. 8, a ring member side movement regulating projection 74 of the movement regulating mechanism 30 may be formed on the lower surface of the aligning ring member 28. In correspondence with this, a movement allowing elongated groove 76 having the same width and length as those of the above elongated hole 32 may be formed at the peripheral edge portion (around the support area) of the upper surface of the susceptor 20 so as to extend in the radial direction of the susceptor 20, as shown in FIG. 7.

With this arrangement, the same effects as those described above can be obtained. In addition, since no projection need be arranged on the surface of the susceptor 20, the manufacture of the susceptor 20 can be facilitated.

In the above embodiment, the movement regulating mechanism is made up of the movement allowing elongated hole 32 and the regulating projection 34. The present invention is not limited to this, and the movement regulating mechanism suffices to prevent the relative movement of the ring member on the upper surface of the susceptor in the circumferential direction or the direction along the ring member of the susceptor, and to permit the radial movement of the ring member. For example, instead of the movement allowing elongated hole, a pair of guide convex members or ridges extending radially which radially movably receive the regulating projection between them may be arranged at an interval slightly larger than the width of the regulating projection on either one of the aligning ring and the susceptor where no regulating projection is formed. The regulating projection is not limited to a circular columnar shape (circular crossection) and may have another shape such as a quadrangular prism (rectangular crossection).

Figure 9:
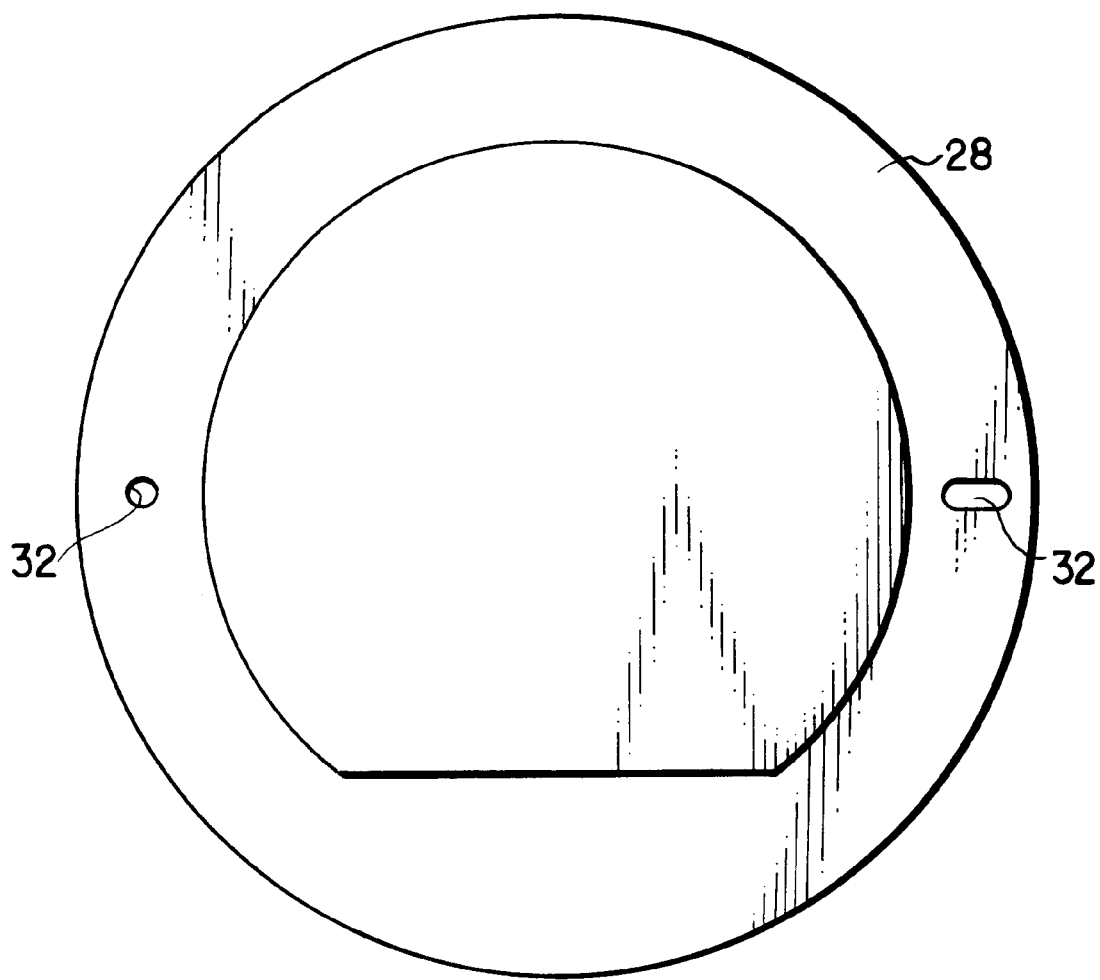
FIG. 9 is a plan view showing a modification of the ring member.

The above embodiment concerns with the case of arranging four movement regulating mechanisms 30. The number of movement regulating mechanisms 30 may however be arbitrarily set as far as it is two or more. Although these movement regulating mechanisms are preferably circumferentially arranged on the ring member (susceptor) at equal intervals, e.g., 180° for two mechanisms or 120° for three mechanisms, they need not be always arranged at equal intervals. A modification of a ring member 28 of a simple construction having two movement regulating holes 32 is shown in FIG. 9. Two holes 32 are arranged at interval of 180°, one of which is a slot extending in a radial direction of the ring member 28 for allowing a relative movement of a projection inserted in the slot, and the other of which is a circular hole having a diameter slightly smaller than that of the projection inserted in the circular hole. Thus, the circular hole 32 does not permit the relative movement of the projection inserted in the circular hole in the radial direction. Hence, the distance the susceptor and the ring member can move relative to each other due to thermal expansion/contraction difference is only half the distance they can so move if both hole are elongate. Nevertheless, the function of the movement regulating mechanism may by practically attained, in this modification. Similarly, in the case of using two slots or elongated holes, one of two projections is formed to have a crossection similar to the slot. The above embodiment has exemplified a single wafer processing apparatus in which one aligning ring member is disposed on the susceptor to process processing objects one by one. Alternatively, a plurality of aligning ring members may be set on one susceptor to process a plurality of processing objects at once.

As the metal for the susceptor 20, Hastelloy is used, but another metal such as molybdenum, nickel, or Inconel (trademark), or the same metal as that for a conventional susceptor such as AlN or $Al_2O_3$ may be used.

Although the above embodiment is directed to a plasma CVD film forming apparatus, the present invention is not limited to this and is applicable to another processing apparatus such as a thermal CVD film forming apparatus, an etching apparatus, a sputtering apparatus, or an ashing apparatus.

The processing object is not limited to a semiconductor wafer but may be a glass substrate, an LCD substrate, or the like.

As has been described above, the processing apparatus of the present invention yields the following good effects.

Since the aligning ring member is placed on the susceptor via the movement regulating mechanism, even when a thermal expansion difference is generated between the susceptor and the ring member with a change in temperature of the processing object, this thermal expansion difference can be absorbed without decreasing the alignment precision. Therefore, the ring member can be prevented from receiving excessive stress generated by the thermal expansion difference and breaking. In addition, the ring member itself can be prevented from loosening.

Particularly, when the susceptor and the ring member are formed of different materials having different thermal expansion coefficients, e.g., the susceptor is formed of a metal, and the ring member is formed of a ceramic material, the breakage prevention effect and the like can be enhanced.

What is claimed is:

1. A processing apparatus comprising:
   a processing chamber;
   a susceptor which is placed in said processing chamber and has one flat surface with a support area on which a processing object is set;
   processing means for processing the processing object set in the support area;
   an aligning ring member which is arranged on the flat surface of said susceptor so as to surround the support area, and defines movements of the processing object set on the support area along the flat surface, the aligning ring member having a flat surface in slidable contact with the flat surface of the susceptor; and
   a plurality of movement regulating mechanisms, provided to said aligning ring member and said susceptor, for permitting relative movement of said aligning ring member and said susceptor in a radial direction due to thermal expansion/contraction difference of the aligning ring member and the susceptor while prohibiting relative rotation thereof;
   each of the movement regulating mechanisms comprising a projection portion which is provided on said aligning ring member and projects to said susceptor, and a guide portion which is provided on said susceptor for receiving said projection portion provided on the aligning ring member.

2. An apparatus according to claim 1, wherein said guide portion is a groove formed in the susceptor.

3. An apparatus according to claim 1, wherein said aligning ring member has an inner circumferential surface with a complementary shape to an outer peripheral shape of the processing object.

4. An apparatus according to claim 1, wherein said processing means is for processing the processing object using a plasma, said susceptor is formed of a metallic material, and said aligning ring member is formed of a high-heat-resistance and high-rigidity nonmetallic material with a thermal expansion coefficient smaller than that of the metallic material forming said susceptor.

5. An apparatus according to claim 4, wherein the nonmetallic material is a ceramic material.

6. A processing apparatus comprising:
   a susceptor having one flat surface with a support area on which processing object is placed;
   processing means for processing the processing object placed on the support area;
   an aligning ring member which is shiftably arranged on the flat surface of said susceptor so as to surround the support area, defines shift of the processing object placed on the support area along the flat surface, and is formed of a material having a thermal expansion coefficient smaller than that of said susceptor, the aligning ring member having a flat surface in slidable contact with the flat surface of the susceptor;
   a plurality of projection portions which are provided on said aligning ring member and project to said susceptor; and
   a plurality of elongated guide portions which are provided to said susceptor and receive the corresponding projection portions therein to permit relative movement of said projection portions in a radial direction while prohibiting relative movement in a direction along the aligning ring member.

7. A processing apparatus comprising:
   a susceptor having one flat surface with a support area on which a processing object is placed;
   processing means for processing the processing object placed on the support area;
   an aligning ring member which is movably arranged on the flat surface of the susceptor to surround the support area, the aligning ring member defining the shift of the processing object placed on the support area, formed of a material having a thermal expansion coefficient smaller than that of said susceptor and having a flat surface in slidable contact with the flat surface of the susceptor;
   a plurality of projections provided on said aligning ring member and projecting to said susceptor; and
   a plurality of guide means provided to said susceptor for receiving the corresponding projections, respectively, at least one of said guide means having an elongated shape to permit relative movement of the projection received therein in a radial direction of the ring member, and said plurality of guide means having shapes to prohibit, as a whole, relative movement of the projections received therein in a rotating direction of the aligning ring member.

8. A processing apparatus comprising:
   a susceptor having one flat surface with a support area on which a processing object is placed;
   processing means for processing the processing object placed on the support area;
   an aligning member which is movably arranged on the flat surface of the susceptor to surround the support area, the aligning member defining the shift of the processing object placed on the support area, formed of a material having a thermal expansion coefficient smaller than that of said susceptor and having a flat surface in slidable contact with the flat surface of the susceptor;
   a plurality of projections provided on said aligning member and projecting to said susceptor; and
   a plurality of guide means provided to said susceptor for receiving the corresponding projections, respectively, the guide means having a shape to permit relative movement of the projection received therein in a radial direction of the aligning member and to prohibit, as a whole, relative movement of the projections received therein in a rotating direction of the aligning member.

9. A processing apparatus comprising:
   a processing chamber;
   a susceptor which is placed in said processing chamber and has a flat surface with a support area on which a processing object is set;
   processing means for processing the processing object set on the support area;
   an aligning ring member which is arranged on the flat surface of said susceptor so as to surround the support area, and defines movement of the processing object set on the support area along the surface, the aligning ring member having a flat surface in slidable contact with the flat surface of the susceptor; and movement regulating means, provided to said aligning ring member and said susceptor, for permitting relative movement of said aligning ring member and said susceptor in a radial direction due to thermal expansion/contraction difference of the alignment ring member and the susceptor while prohibiting relative rotation thereof.

10. An apparatus according to claim 9, wherein said movement regulating means comprises a plurality of movement regulating mechanisms arranged along said aligning ring member at intervals.

11. An apparatus according to claim 10, wherein said plurality of movement regulating mechanisms are arranged along said aligning ring member at regular intervals.

12. An apparatus according to claim 10, wherein each of said movement regulating mechanisms comprises a projection portion which is provided on one of said aligning ring member and said susceptor and projects to the other one of said aligning ring member and said susceptor, and a guide portion which is provided on the other one of said aligning ring member and said susceptor and permits relative movement of said projection portion in a radial direction while prohibiting relative movement along the ring member.

13. An apparatus according to claim 12, wherein said guide portion has a groove which is formed in the other one of said aligning ring member and said susceptor to extend in the radial direction and in which said projection portion is inserted movably in the radial direction.

14. An apparatus according to claim 12, wherein said guide portion has elongated hole which is formed in said aligning ring member to extend in the radial direction and in which said projection portion is inserted movably in the radial direction.

15. An apparatus according to claim 9, wherein said aligning ring member has an inner circumferential surface with a complementary shape to an outer peripheral shape of the processing object.

16. An apparatus according to claim 9, wherein said processing means comprises means for processing the processing object using a plasma, said susceptor is formed of a conductive metal, and said aligning ring member is formed of a high-heat-resistance and high-rigidity nonmetallic material.

17. An apparatus according to claim 16, wherein the nonmetallic material is a ceramic material.

18. A processing apparatus comprising:

a susceptor having a flat surface with a support area on which a processing object is placed;

processing means for processing the processing object placed on the support area;

an aligning ring member which is shiftably arranged on the flat surface of said susceptor so as to surround the support area, defines shift of the processing object placed on the support area along the surface, and is formed of a material having a thermal expansion coefficient smaller than a thermal expansion coefficient of said susceptor, the aligning ring member having a flat surface in slidable contact with the flat surface of the susceptor;

a plurality of projection portions which are provided on one of said aligning ring member and said susceptor at predetermined intervals and project to the other one of said aligning ring member and said susceptor; and a plurality of elongated guide portions which are provided to the other one of said aligning ring member and said susceptor and receive the corresponding projection portions therein to permit relative movement of said projection portions in a radial direction while prohibiting relative movement in a direction along the ring member.

19. An apparatus according to claim 18, wherein each of said projection portions is received in a corresponding elongated guide portion so as to be located at an end portion of said guide portion on an inner side of said ring member in a longitudinal direction.

20. A processing apparatus comprising:

a susceptor having a flat surface with a support area on which a processing object is placed;

processing means for processing the processing object placed on the support area;

an aligning ring member which is movably arranged on the flat surface of the susceptor to surround the support area, the aligning ring member defining the shift of the processing object placed on the support area, formed of a material having a thermal expansion coefficient smaller than a thermal expansion coefficient of the susceptor and having a flat surface in slidable contact with the flat surface of the susceptor;

a plurality of projections provided on one of said aligning ring member and said susceptor at intervals along the ring member and projecting to the other of said aligning ring member and said susceptor; and a plurality of guide means provided to the other of said aligning ring member and said susceptor for receiving the corresponding projections, respectively, at least one of guide means having an elongated shape to permit relative movement of the projection received therein in a radial direction of the ring member, and said plurality of guide means having shapes to prohibit relative movement of the projections received therein in a rotating direction of the ring member as a whole.

21. A processing apparatus comprising:

a susceptor having a flat surface with a support area on which a processing object is placed;

processing means for processing the processing object placed on the support area;

an aligning member which is movably arranged on the flat surface of the susceptor to surround the support area, the aligning member defining the shift of the processing object placed on the support area, formed of material having a thermal expansion coefficient different from that of the susceptor and having a flat surface in slidable contact with the flat surface of the susceptor;

a plurality of projections provided on one of said aligning member and said susceptor at intervals along the aligning member and projecting to the other of said aligning member and said susceptor; and a plurality of guide means provided to the other of said aligning member and said susceptor and receiving the corresponding projections, respectively, the guide means having shapes to permit relative movement of the projection received therein in a radial direction of the aligning member, and to prohibit relative movement of the projections received therein in a rotating direction of the aligning member as a whole.

22. An apparatus according to claim 9 wherein said aligning ring member has another flat surface parallel to said flat surface of the aligning ring member.

23. An apparatus according to claim 9 wherein said aligning ring member has an inner peripheral surface perpendicular to the flat surface of said aligning ring member.

* * * * *